United States Patent
Chen et al.

(10) Patent No.: US 6,940,779 B2
(45) Date of Patent: Sep. 6, 2005

(54) PROGRAMMABLE BROADCAST INITIALIZATION OF MEMORY BLOCKS

(75) Inventors: Zheng (Jeff) Chen, Macungie, CA (US); John Schadt, Bethlehem, PA (US); Barry Britton, Orefield, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 15 days.

(21) Appl. No.: 10/641,260

(22) Filed: Aug. 13, 2003

(65) Prior Publication Data

US 2005/0035781 A1 Feb. 17, 2005

(51) Int. Cl.[7] .............................................. G11C 7/00
(52) U.S. Cl. ........................... 365/230.03; 365/230.01; 365/230.05; 365/189.08; 326/38; 326/41
(58) Field of Search .... 326/38–41; 365/230.01–230.03, 365/230.05, 189.08

(56) References Cited

U.S. PATENT DOCUMENTS

| | | | |
|---|---|---|---|
| 5,802,003 A | * 9/1998 | Iadanza et al. | 365/230.03 |
| 5,914,906 A | * 6/1999 | Iadanza et al. | 365/230.03 |
| 6,127,843 A | * 10/2000 | Agrawal et al. | 326/40 |
| 6,483,342 B2 | 11/2002 | Britton et al. | |
| 6,772,230 B2 | * 8/2004 | Chen et al. | 710/8 |

OTHER PUBLICATIONS

U.S. Appl. No. 09/864,290, filed May 25, 2001 entitled Field Programmable Gate Array (FPGA) Bit Stream Format.

* cited by examiner

*Primary Examiner*—Vibol Tan
(74) *Attorney, Agent, or Firm*—MacPherson Kwok Che & Heid LLP; Greg J. Michelson

(57) ABSTRACT

Systems and methods are disclosed herein to initialize memory blocks of a programmable logic device. For example in accordance with an embodiment of the present invention, a system bus extension is provided for the memory blocks that functions as a unidirectional broadcasting write bus. A read bus may also be provided to read data stored in the memory blocks.

32 Claims, 3 Drawing Sheets

US 6,940,779 B2

PROGRAMMABLE BROADCAST INITIALIZATION OF MEMORY BLOCKS

TECHNICAL FIELD

The present invention relates generally to electrical circuits and, more particularly, to memory blocks within an integrated circuit, such as a programmable logic device.

BACKGROUND

Programmable logic devices (PLDs) have been constantly evolving to include a greater number of logic gates along with additional memory to support various memory intensive applications. The memory is often arranged as blocks of memory (one example of which is referred to as embedded memory blocks (EMBs)), with the blocks typically aligned in rows and/or columns. The memory may be formed, for example, from static random access memory (SRAM) cells, which may be configured to function in various modes (e.g., first-in-first out (FIFO), RAM, or read only memory (ROM)) having different data/address bus widths.

After a PLD is powered-up and configured and depending upon the intended application, the contents of the memory may be unknown (e.g., a do not care condition when used as RAM). Alternatively, it may be desired that the contents of one or more of the blocks of memory be known or predefined (e.g., when used as ROM) as the PLD begins to perform its user-defined functions (i.e., user mode or normal mode). If the contents of the memory must be known (pre-defined), the blocks of memory generally must be initialized (pre-loaded) with the desired information (e.g., configuration data via a configuration bitstream) during configuration of the PLD.

For example, one technique for initializing the memory is to view a row (or column) of the blocks of memory as one large memory block and access the address and data lines of the blocks of memory in that row (column) at the same time to write a very wide word into one address of the large memory block. One drawback of this technique is that if only one block of memory requires initialization, the whole row (or column) of the blocks of memory has to be initialized and the equivalent amount of configuration data for all of the blocks of memory in that whole row has to be downloaded. This may add considerably to the time required to configure the PLD and also waste bitstream storage space.

As another example, a system bus may be embedded into a PLD (e.g., a complex programmable logic device (CPLD), a field programmable gate array (FPGA), or a programmable interconnect device) to access the blocks of memory in RAM mode, each with its own bus address. Thus, each block of memory can be independently initialized via the system bus as the bitstream data is transferred by following a bus protocol. Further details regarding an exemplary system bus may be found in U.S. Pat. No. 6,483,342, which is incorporated herein by reference in its entirety.

One drawback of the conventional embedded system bus technique is that as the number of blocks of memory increases, it becomes difficult to extend the system bus to all of the blocks of memory distributed within the PLD without encountering possibly unacceptable system bus performance. Furthermore, if more than one block of memory needs to be initialized with the same data, then the same bitstream content must be repeatedly downloaded through the system bus because each block of memory has its own unique address. Thus, for memory initialization, this conventional system bus technique may add considerably to the time required to configure the PLD and waste bitstream storage space. As a result, there is a need for improved techniques for initializing memory within a programmable logic device.

SUMMARY

Systems and methods are disclosed herein to initialize memory blocks of a programmable logic device, such as during configuration (including full/partial reconfiguration). For example, in accordance with an embodiment of the present invention, a system bus extension is provided, for the memory blocks, which functions as a unidirectional broadcasting write bus. Each memory block may have a locally programmable bus identification number for addressing purposes. Furthermore, single or multiple memory blocks may be initialized by the same configuration data bits. The memory blocks may be individually configured as to whether to accept initialization and, if so, whether to accept initialization during configuration, reconfiguration, partial configuration, or any combination of these.

As another example and in accordance with an embodiment of the present invention, the contents in the memory block may also be read back, for example, by the addition of a read bus to the write bus. Furthermore, in accordance with another embodiment of the present invention, read and write access may be made available through the read and/or write bus after configuration has been completed (i.e., while the programmable logic device is performing its intended logic functions, referred to as user mode). Additionally, the techniques discussed herein may be applied to circuit elements (besides memory) within the programmable logic device, which may be accessed via a bus structure.

More specifically, in accordance with one embodiment of the present invention, a programmable logic device includes a plurality of memory blocks adapted to store data; and an initialization bus, coupled to the memory blocks, wherein the initialization bus is unidirectional and adapted to provide initialization data to the memory blocks.

In accordance with another embodiment of the present invention, a programmable logic device includes a system bus; blocks of memory; an initialization bus, coupled to the blocks of memory, adapted to initialize the blocks of memory with data received from the system bus based on an address and a programmable bus identification number associated with each of the blocks of memory, wherein the programmable bus identification number may be the same for one or more of the blocks of memory; and an interface between the initialization bus and the system bus.

In accordance with another embodiment of the present invention, a method of initializing blocks of memory within a programmable logic device includes providing initialization data along a unidirectional bus to the blocks of memory; matching an address of the initialization data to a programmable bus identification number associated with each of the blocks of memory; and writing the initialization data to the blocks of memory whose programmable bus identification number matches the address during the matching operation.

In accordance with another embodiment of the present invention, a programmable logic device includes a memory; and a plurality of multiplexers associated with the memory, wherein the multiplexers are controlled to select between an initialization bus and a system bus for writing data to the memory.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Figure 1:
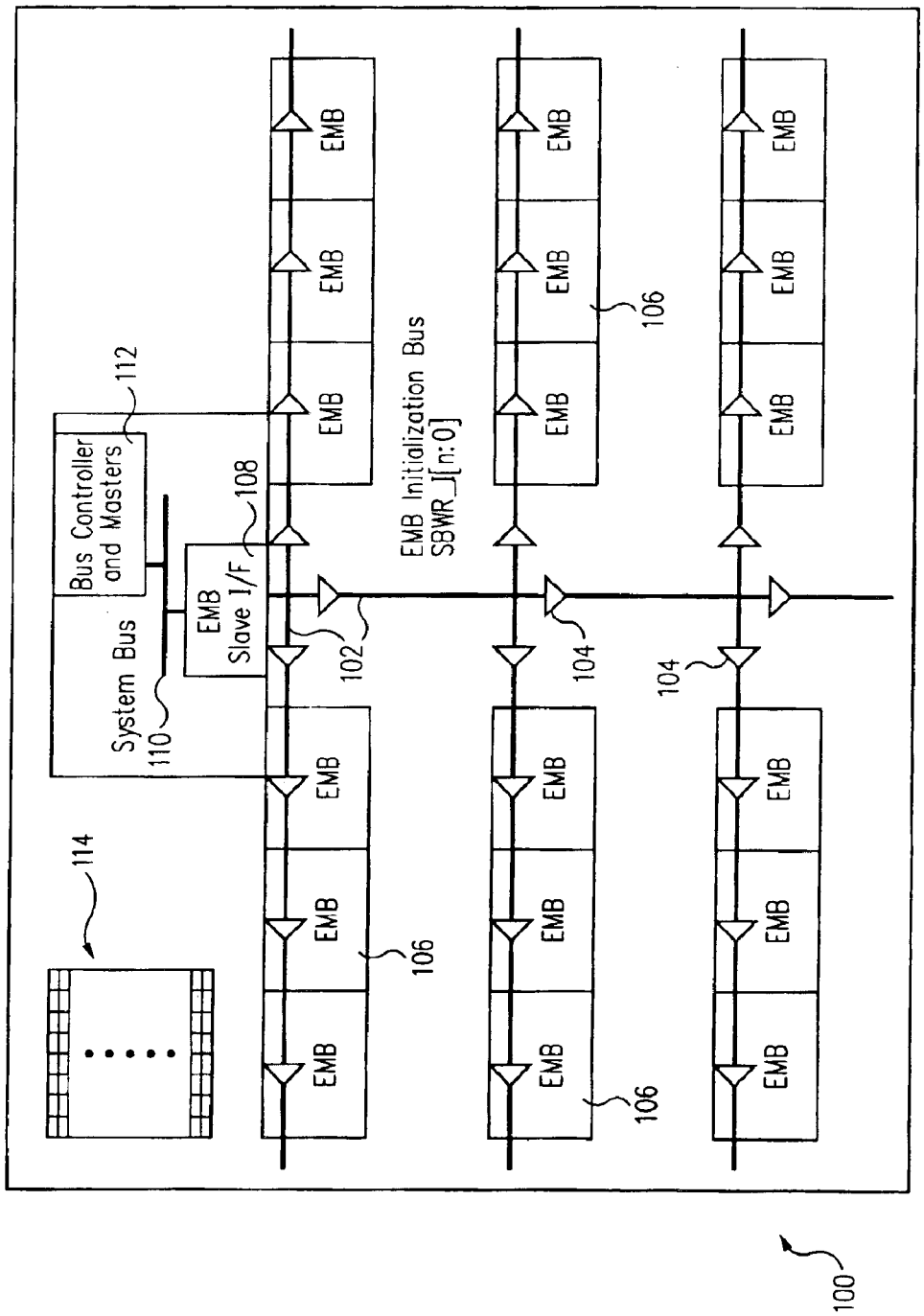
FIG. 1 shows a block diagram illustrating a broadcast initialization bus in accordance with an embodiment of the present invention.

FIG. 1 shows a block diagram illustrating a broadcast initialization bus system 100 in accordance with an embodiment of the present invention. System 100 includes an initialization bus 102, buffers 104, memory blocks 106, a memory slave interface 108, a system bus 110, a bus controller 112, and configuration memory cells 114.

Initialization bus 102 is a unidirectional bus that is distributed to each memory block 106 (e.g., EMB). Buffers 104 provide buffering for initialization bus 102 to buffer and drive the information carried by initialization bus 102 to memory blocks 106.

Initialization bus 102 originates from memory slave interface 108, which serves as an interface to system bus 110 and bus controller 112 (e.g., which may include bus masters). For example, memory slave interface 108 functions as a bridge between system bus 110 and initialization bus 102. Thus, for this example, memory slave interface 108 receives write transfers from system bus 110 and converts the write transfers into appropriately sized write transfers (e.g., byte-sized) for initialization bus 102. If a read transfer is received by memory slave interface 108 from system bus 110, memory slave interface 108 may provide a response to system bus 110 indicating a command error (because in this exemplary embodiment initialization bus 102 is only a unidirectional bus for writing data to memory blocks 106).

Broadcast initialization bus system 100 may be implemented as part of a programmable logic device to provide broadcast initialization of memory within the programmable logic device. As an exemplary implementation, broadcast initialization bus system 100 may provide a programmable broadcast initialization of embedded memory blocks within a field programmable gate array.

By providing a unidirectional broadcasting bus, broadcast initialization bus system 100 may provide certain advantages over a full-feature system bus extension, such as for example an easier layout of initialization bus 102 than a conventional system bus extension. Furthermore, as the bus is extended, there is less significant impact on performance for initialization bus 102 than a conventional system bus extension due to the clock running in the same direction as the write signals.

In terms of a specific implementation example, initialization bus 102 functions as a unidirectional broadcasting write bus to carry a write clock, a write enable, control signals, write data (e.g., n-bits), and write addresses (e.g., m-bits). The address bus width may be dependent upon the size of memory blocks 106. For example, to support 1024 of memory blocks 106, each being 2048 by 9 bits, the address bus width may be 21 bits wide. The upper 10 bits of the 21 bits are used to identify one of the 1024 memory blocks 106 (i.e., $2^{10}$ equals 1024). The lower 11 bits of the 21 bits are used to select 1 of the 2048 addresses within one of memory blocks 106 (i.e., $2^{11}$ equals 2048).

The memory space allocation for memory slave interface 108 may be less for the side associated with system bus 110 than for the side associated with interface bus 102. For example, the address bus of system bus 110 may be 18-bits and the memory space allocated for memory slave interface 108 may be 128 KB (i.e., a 17-bit address), while the address bus of initialization bus 102 may be 21-bits. The 4 additional bits (i.e., 21–17) may be provided by configuration logic or a register in bus controller 112, which may be set by a bus master before the initialization of one of memory blocks 106.

This technique may be viewed as a virtual expansion of bus memory space. Furthermore, the memory space allocated to memory slave interface 108 may be transferred to other slaves, after configuration of the programmable logic device and initialization of memory blocks 106, because initialization bus 102 can be disabled once the programmable logic device enters user mode.

For memory blocks 106, each has a locally programmable bus identification number, which can be stored by configuration memory cells 114 and matched with the address (e.g., upper address bits) carried by initialization bus 102 to determine which of memory blocks 106 are to receive the data transferred on initialization bus 102. As an example, the programmable bus identification number may be stored by configuration memory cells 114 (e.g., static random access memory cells or other known configuration techniques, such as fuses), which can be configured prior to initialization of memory blocks 106.

Configuration memory cells 114 may be arranged as a block of memory, as shown in FIG. 1, or as individual memory cells distributed within system 100 (e.g., distributed throughout a programmable logic device that incorporates system 100). For example, configuration memory cells 114 may be distributed and associated with corresponding memory blocks 106 to store the programmable bus identification number and other programmable features of memory blocks 106 (e.g., initialization control signals described herein).

By employing the programmable bus identification numbers for memory blocks 106, the programmable logic device's software may be free to place a user synthesized memory into any one of memory blocks 106 where it is best suited within the programmable logic device (without the requirement of a hardwired address). Furthermore, one memory block 106 may be independently initialized (by having a unique bus identification number) or a number of memory blocks 106 may be initialized with the same information (if memory blocks 106 have the same bus identification number) that is downloaded only once via the configuration bitstream.

Memory blocks 106, in accordance with an embodiment of the present invention, may also be programmable as to whether to permit initialization. For example, each memory block 106 may programmably permit initialization during configuration, reconfiguration, or partial reconfiguration, or any combination of these. Consequently, each memory block 106 may be configured to not allow initialization, allow initialization during configuration, partial reconfiguration, and complete reconfiguration, or allow initialization for complete configuration or reconfiguration but not allow initialization for partial reconfiguration. The initialization control signals may, for example, be programmed into configuration memory cells 114 associated with memory blocks 106, as described in further detail herein.

Figure 2:
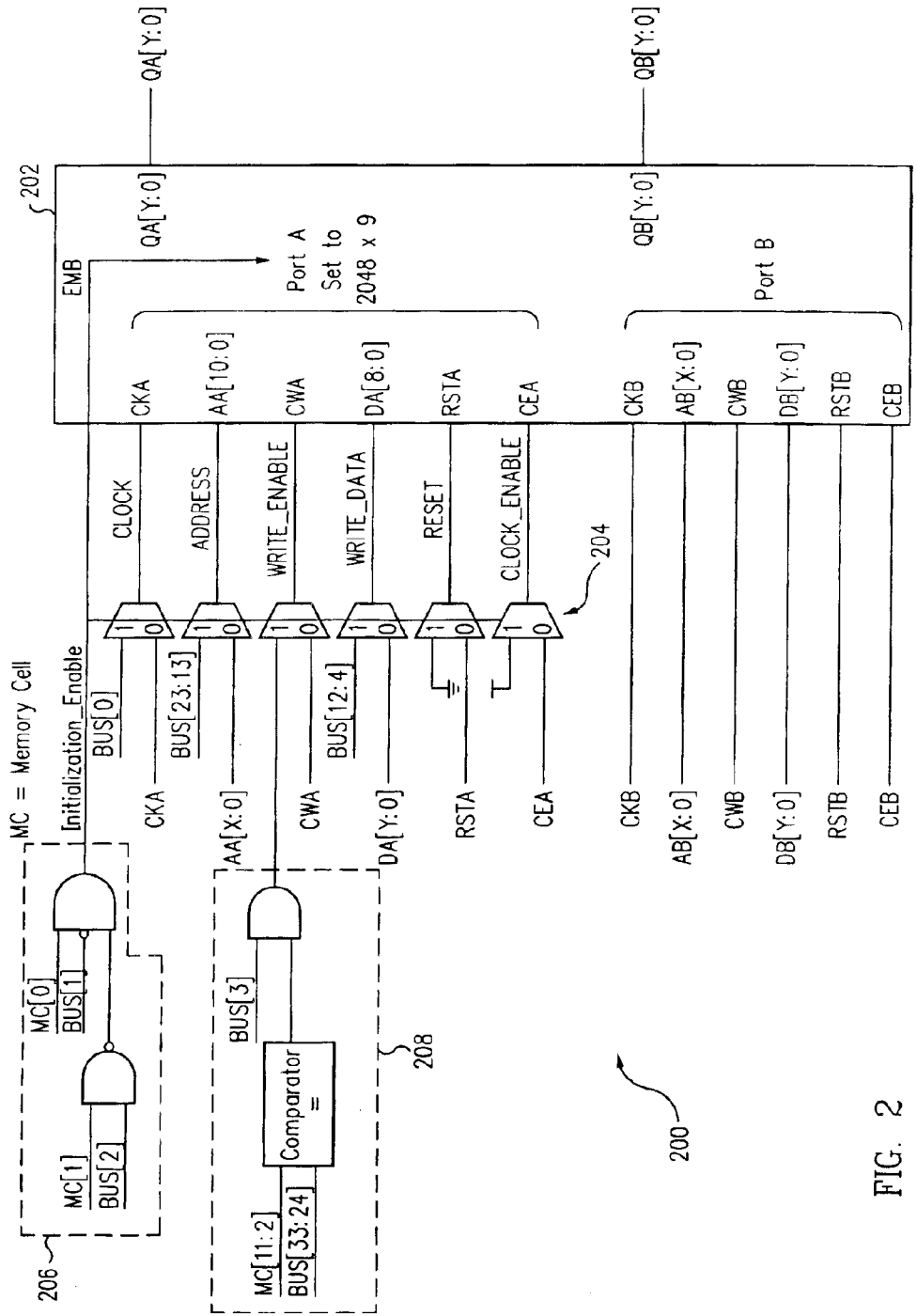
FIG. 2 shows a block of memory and associated circuits in accordance with an embodiment of the present invention.

In general and in accordance with an embodiment of the present invention, after configuration, partial reconfiguration, or complete reconfiguration, initialization bus 102 does not have access to memory blocks 106 until some form of configuration is initiated (e.g., configuration, reconfiguration, or partial reconfiguration). During configuration (including partial or complete reconfiguration), if one or more of memory blocks 106 require initialization, initialization bus 102 is employed to transfer the information to the desired ones of memory blocks 106 (e.g., initialization bus 102 serves as a write port for memory blocks 106 requiring initialization as illustrated in FIG. 2 and discussed herein).

Table 1 summarizes an exemplary set of functions and bus lines that may be provided by initialization bus 102. For example, one line ([0]) of initialization bus 102 carries a clock signal to clock data into memory blocks 106 that are enabled for initialization (e.g., this line transfers a write port clock for initialization of desired memory blocks 106).

Two lines ([2:1]) of initialization bus 102 carry configuration status signals. As an example, configuration status signals [1,1], [1,0], or [0,0] indicate whether configuration for the programmable logic device has completed (e.g., operating in or entering user mode), a partial reconfiguration is occurring, or a full configuration (or reconfiguration) is occurring, respectively. The configuration status signals may be utilized, for example, by memory blocks 106 to determine whether initialization is permitted (e.g., whether the configuration status signals match certain ones of the programmed configuration memory cells 114 that control initialization for the associated memory block 106).

Line [3] of initialization bus 102 carries a write strobe to indicate a write transfer to the address on the address bus lines (e.g., lines [x:13]) of initialization bus 102. If initialization is enabled and the upper address bits match the programmable bus identification number for one or more of memory blocks 106, then the write strobe functions as a write enable for those memory blocks 106.

Lines [12:4] of initialization bus 102 carry the 9 bits of data to be written to one or more of memory blocks 106 for this exemplary embodiment (i.e., the number of lines will depend upon the number of bits to be written (e.g., the size of the word)). Lines [x:13] of initialization bus 102 carry the write address. As an example, the upper bits of the write address will be used to determine if there is a match with the programmable bus identification number of memory blocks 106. The remaining bits (lower bits) of the write address designate the address within memory blocks 106 that have a programmable bus identification number that matches the upper bits of the write address.

For example, if the size of each of memory blocks 106 is 2048 by 9 bits, the lower bits of the write address are 11 bits. The number of upper bits of the write address will depend on the number of memory blocks 106 included in the programmable logic device, as described in the example above (i.e., if there are 1024 of memory blocks 106, then the number of upper bits equals 10). For this example, lines [x:13] would be lines [33:13], with "x" equal to 33, as illustrated in an exemplary fashion in FIG. 2 and discussed in further detail herein.

However, the number of upper bits of the write address may be further limited. For example, the number of upper bits of the write address may depend on the number of different initialization contents (formats) allowed on the programmable logic device. As an example, if there are 1024 memory blocks 106 on the programmable logic device, but only 256 different initialization contents allowed for a given configuration (including partial reconfiguration), then the number of upper bits of the write address may be limited 8 bits (i.e., the width of the upper address is 8 bits).

TABLE 1

| Initialization Bus Lines [0:x] | Description |
| --- | --- |
| [0] | Write Clock |
| [2:1] | Configuration Status Signals |
| [3] | Write Strobe |
| [12:4] | Write Data |
| [x:13] | Write Address |

Each one of memory blocks 106 may receive or be at least partially controlled by some input signals from configuration memory cells (e.g., SRAM cells or fuses shown in an exemplary fashion by configuration memory cells 114 of FIG. 1) during the initialization process. The configuration memory cells may be configured by conventional generic memory access circuits, which may be separate from or part of broadcast initialization bus system 100. The configuration memory cells generally are configured before the start of initialization of memory blocks 106. For example, a bitstream format may be employed, such as described in U.S. Pat. No. 6,483,342 or U.S. patent application Ser. No. 09/864,290 (filed May 25, 2001), which distinguish the bitstream portion for initialization of memory blocks 106 with a different header and postample.

For example, some of configuration memory cells 114 may be utilized to set the programmable bus identification number for memory blocks 106 and also set whether memory blocks 106 can be initialized (e.g., deny initialization or permit initialization during configuration and/or partial reconfiguration). For example, Table 2 illustrates an exemplary number of memory cells (e.g., a number of configuration memory cells 114) and a description of their intended functions or what they control (which is further illustrated in an exemplary fashion by FIG. 2 and described in its corresponding text). Memory cells [1:0] control initialization of the associated memory block 106. For example, if both memory cells provide an output signal (0,0), (0,1), or (1,1), then initialization is disabled for any configuration, initialization is enabled for any configuration, or initialization is enabled for full configuration or reconfiguration but disabled for partial reconfiguration, respectively, for the associated memory block 106.

Memory cells [Y:2] set the programmable bus identification number for the associated memory block 106. For example, the output signals provided by memory cells 2 through "Y" may be matched to the upper address bits carried on initialization bus 102 to determine if the associated memory block 106 is being addressed.

TABLE 2

| Memory Cells | Description |
| --- | --- |
| [1:0] | Initialization control |
| [Y:2] | Identification Number |

The properties of configuration memory cells 114 for each of memory blocks 106 may be implemented by the programmable logic device's design software. For example, the default value for configuration memory cells 114 may be set to zero so that memory blocks 106 can not be initialized by default. A user may set a desired memory block 106 to allow initialization and the settings (e.g., for initialization setting and identification numbers) incorporated into the configuration bitstream. The initialization content for memory blocks 106 may also be incorporated into the configuration bitstream by the design software.

During configuration, for example, each of memory blocks 106 that are enabled for initialization will couple initialization bus 102 (e.g., a byte-write bus) to a write input port (e.g., via a switch) and set the write input port to a proper width (e.g., a byte width) after the appropriate configuration memory cells are downloaded. As an implementation example, the coupling may be controlled via multiplexers. In general, each memory block 106 may have associated logic to utilize its memory cells as first-in-first out (FIFO), ROM, or RAM (or other user-selectable modes) with different bus widths (e.g., byte-bus width or 9-bit bus width, depending upon the application). Consequently, accommodating initialization bus 102 as an input for each memory block 106 may require only a relatively small amount of additional overhead to the existing logic (e.g., additional two-to-1 multiplexers to the write circuits) for each memory block 106.

For example as an exemplary implementation, FIG. 2 illustrates a circuit 200, which shows a memory 202 and associated circuitry, in accordance with an embodiment of the present invention. Memory 202, which may be an exemplary implementation of one of memory blocks 106 (FIG. 1), includes two write ports (labeled Ports A and B, which may form part of a dual-port memory) that receive corresponding signals (e.g., clock, address, write enable, write data, reset, and clock enable).

As shown in FIG. 2, signals from two lines of an initialization bus (labeled bus[1] and bus[2]) and signals from two memory cells (labeled MC[0] and MC[1])) are received by logic 206, which determines based on these signals whether memory 202 is to be initialized. If memory 202 is to be initialized, then logic 206 controls multiplexers 204 (e.g., by an assertion of an initialization_enable signal) to pass signals from the initialization bus to memory 202. Logic 206 may also, for example, configure memory 202 such as by setting the Port A to a 2048 by 9 bit memory configuration.

As further discussed in reference to Tables 1 and 2 and illustrated in FIG. 2 for an exemplary implementation, a clock signal is carried on the initialization bus (line labeled bus[0]), data signals are carried on the initialization bus lines [12:4], and some address signals are carried on the initialization bus lines [13:23] to select one of the 2048 addresses of Port A.

A write enable (i.e., a write strobe) is controlled by logic 208, which receives a signal from the initialization bus line [3] and compares signals from the memory cells (MC[11:2]) and the initialization bus lines [33:24]. Memory cells (MC [11:2]) are programmed with the programmable bus identification number for memory 202, which is compared with the upper address bits carried by the initialization bus lines [33:24] to determine if memory 202 is being addressed (for this example there being 1024 different ones (not shown) of memory 202).

In general for FIG. 1 (with an exemplary implementation shown in FIG. 2), when the address carried by initialization bus 102 matches the programmable bus identification number of the associated memory block 106, the write strobe signal carried by initialization bus 102 is switched to a write enable terminal of memory block 106 and the data provided by the configuration bitstream and carried by initialization bus 102 is then written into memory cells of the memory block 106. If more than one memory block 106 has the same programmable bus identification number, the data carried by initialization bus 102 is also stored in those memory blocks 106 at approximately the same time (e.g., similar to how a radio broadcast message is received at approximately the same time by multiple receivers tuned to the same frequency).

In accordance with an embodiment of the present invention, initialization bus 102 and memory slave interface 108 may be expanded to include a unidirectional read data bus (in the opposite direction than described above for initialization bus 102) to provide readback of memory blocks 106 to system bus 110. Furthermore, the write clock and address lines in initialization bus 102 may be used for readback after configuration or partial configuration is completed.

Figure 3:
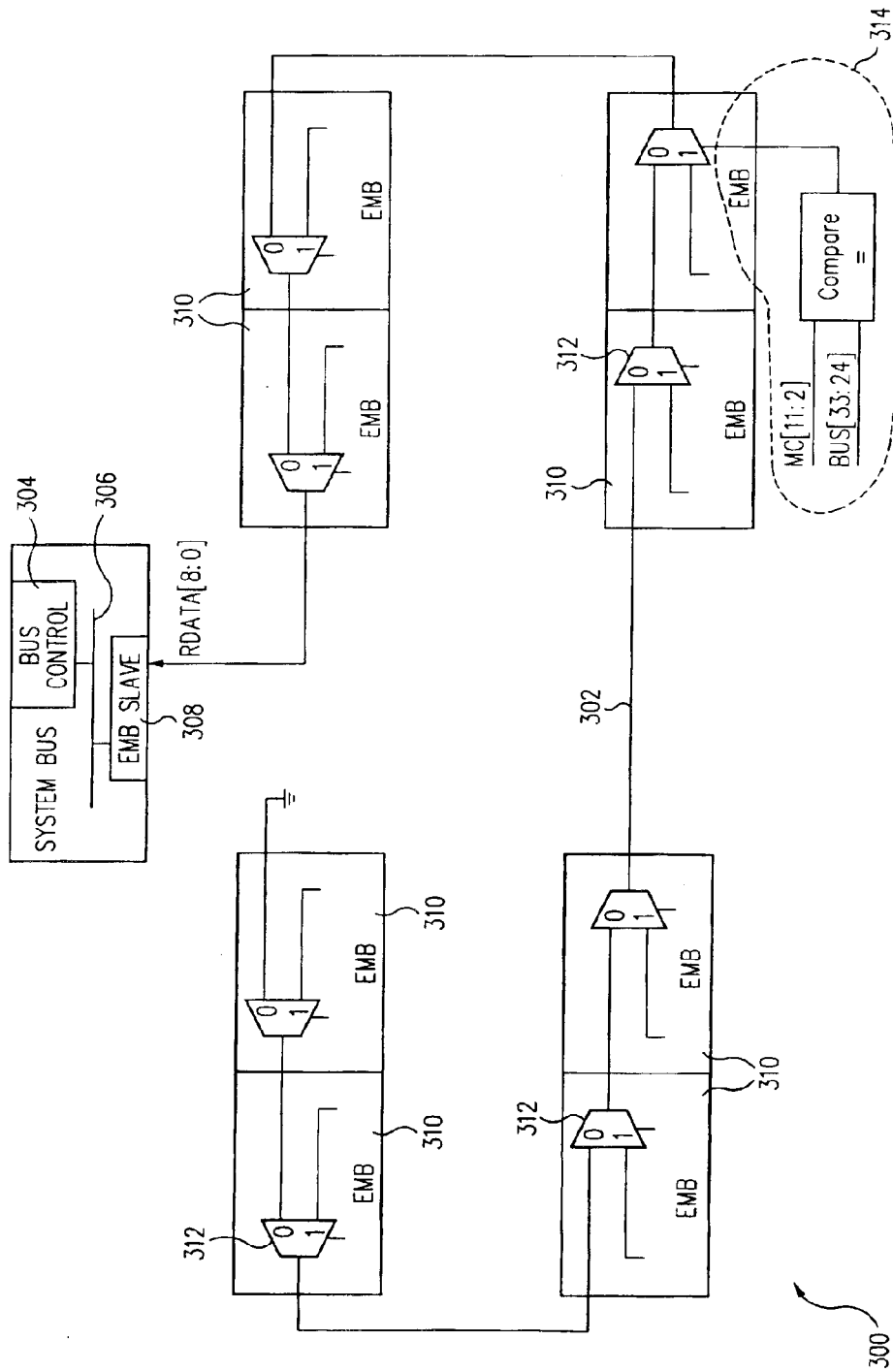
FIG. 3 shows a block diagram illustrating a read bus in accordance with an embodiment of the present invention.

For example, FIG. 3 illustrates a system 300, which includes a read bus 302, in accordance with an embodiment of the present invention. Read bus 302 illustrates a technique to read back the data from memory blocks 310 such as, for example, after initialization. Similar to system 100, system 300 includes a memory slave interface 308, a system bus 306, and a bus controller 304, which perform similar functions as described in reference to FIG. 1, except in a write rather than a read context, and therefore their operational details will not be repeated. It should also be understood that system 300 (namely for example, read bus 302) may be incorporated into system 100 to provide read back capability to system 100.

Signals on read bus 302 propagate through multiplexers 312, with one multiplexer 312 associated with each memory block 310. Also associated with each memory block 310 are configuration memory cells, which store a programmable bus identification number for memory block 310. For example, logic 314, associated with each memory block 310, may receive signals from the configuration memory cells (e.g., MC[11:2]) and address signals (e.g., carried by bus lines [33:24] of read bus 302 if, for example, there are 1024 of memory cells 310 as discussed similarly in the above example). Based on these received signals, logic 314 controls multiplexer 312 to route signals carried on read bus 302 from the prior memory block 310 or to route signals from the associated memory block 310 onto read bus 302. Consequently, if more than one memory block 310 has the same programmable bus identification number, the closest memory block 310 to memory slave interface 308 being addressed will provide its data onto read bus 302 (thus avoiding a read conflict).

If read bus 302 is incorporated into system 100, each memory block 106 may have another set of programmable options for readback enable and readback bus identification. However, the readback bus identification must be unique for each memory block 106 enabled for readback to avoid conflicts or the read back bus may be setup to read back only one of the memory blocks (as illustrated in FIG. 3). The read data bus may be implemented according to known techniques, such as for example a multiplexed bus or an AND/OR bus.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
   a plurality of memory blocks adapted to store data;
   an initialization bus, coupled to the memory blocks, wherein the initialization bus is unidirectional and adapted to provide initialization data to the memory blocks; and
   buffers, coupled to the initialization bus, adapted to buffer and drive the initialization data and signals carried by the initialization bus.

2. The programmable logic device of claim 1, wherein a programmable bus identification number is associated with each of the memory blocks, the programmable bus identification number adapted to be matched to an address provided by the initialization bus to determine if the initialization data is to be stored by the associated memory block.

3. The programmable logic device of claim 2, wherein configuration memory cells are adapted to be programmed with the programmable bus identification number for the associated one of the memory blocks.

4. The programmable logic device of claim 2, wherein more than one of the memory blocks may have the same programmable bus identification number.

5. The programmable logic device of claim 2, further comprising:
   a bus controller;
   a system bus coupled to the bus controller; and
   a memory slave interface, coupled to the system bus, adapted to provide an interface between the initialization bus and the system bus and the bus controller.

6. The programmable logic device of claim 5, wherein the bus controller is adapted to provide the initialization bus with one or more address bits via configurable logic or one or more registers.

7. The programmable logic device of claim 1, wherein configuration memory cells are associated with each of the memory blocks and adapted to provide initialization control signals that determine whether the associated memory block is to accept or reject the initialization data.

8. The programmable logic device of claim 7, wherein the configuration memory cells are adapted to control whether the associated memory block is to deny the initialization data, accept the initialization data during configuration, reconfiguration, or partial reconfiguration, or deny the initialization data during partial reconfiguration only.

9. The programmable logic device of claim 1, wherein the initialization bus is decoupled from the memory blocks after the configuration, the configuration comprising reconfiguration and/or partial reconfiguration.

10. The programmable logic device of claim 1, wherein the initialization bus is adapted to provide a write clock, configuration status signals, a write strobe, the initialization data, and a write address.

11. The programmable logic device of claim 1, further comprising a read bus adapted to read back data stored in the blocks of memory.

12. The programmable logic device of claim 1, wherein the initialization bus is further adapted to provide data to circuit elements within the programmable logic device.

13. The programmable logic device of claim 1, further comprising a plurality of multiplexers corresponding to each of the blocks of memory, wherein the multiplexers are controlled to route signals from the initialization bus or from a system bus.

14. The programmable logic device of claim 1, wherein the initialization bus is further adapted to write data to the blocks of memory during user mode.

15. A programmable logic device comprising:
   a system bus;
   blocks of memory;
   an initialization bus, coupled to the blocks of memory, adapted to initialize the blocks of memory with data received from the system bus based on an address and a programmable bus identification number associated with each of the blocks of memory, wherein the programmable bus identification number may be the same for one or more of the blocks of memory; and
   an interface between the initialization bus and the system bus.

16. The programmable logic device of claim 15, further comprising buffers, coupled to the initialization bus, adapted to drive the data carried by the initialization bus.

17. The programmable logic device of claim 15, wherein each of the blocks of memory are controlled by initialization control signals which are compared to initialization signals associated with each of the blocks of memory to determine whether the blocks of memory accept the data during configuration, which may include reconfiguration and/or partial reconfiguration.

18. The programmable logic device of claim 15, wherein the initialization bus is decoupled from the blocks of memory after the configuration.

19. The programmable logic device of claim 15, wherein the initialization bus is unidirectional.

20. The programmable logic device of claim 15, wherein the initialization bus further comprises a read bus, coupled to the blocks of memory, adapted to read the data from the blocks of memory after initialization and/or during a user mode.

21. The programmable logic device of claim 15, wherein the initialization bus is further adapted to write data to the blocks of memory during user mode.

22. The programmable logic device of claim 15, wherein the initialization bus is further adapted to provide data to circuit elements within the programmable logic device.

23. The programmable logic device of claim 15, further comprising a system bus controller, wherein the interface is adapted to interface the initialization bus with the system bus and the system bus controller.

24. A method of initializing blocks of memory within a programmable logic device, the method comprising:
   providing initialization data along a unidirectional bus to the blocks of memory;
   matching an address of the initialization data to a programmable bus identification number associated with each of the blocks of memory; and
   writing the initialization data to the blocks of memory whose programmable bus identification number matches the address during the matching operation.

25. The method of claim 24, wherein the programmable bus identification number may be the same for more than one of the blocks of memory.

26. The method of claim 24, further comprising:
   providing configuration status signals along the unidirectional bus to the blocks of memory; and
   matching the configuration status signals to an initialization control signal associated with each of the blocks of memory to determine whether the writing operation is permitted.

27. The method of claim 24, further comprising providing write data to the blocks of memory via the unidirectional bus during user mode.

28. The method of claim 24, further comprising reading the initialization data or other data from the blocks of memory via a read bus associated with the unidirectional bus.

29. The method of claim 28, further comprising providing data to circuit elements within the programmable logic device via the unidirectional bus.

30. A programmable logic device comprising:
   a memory;
   a plurality of multiplexers associated with the memory, wherein the multiplexers are controlled to select between an initialization bus and a system bus for writing data to the memory; and
   configuration memory cells adapted to store an initialization control signal for the memory, wherein the initialization control signal is compared to an initialization status signal provided by the initialization bus to determine whether the multiplexers select the initialization bus.

31. The programmable logic device of claim 30, further comprising configuration memory cells adapted to store an identification number for the memory.

32. The programmable logic device of claim 31, wherein the identification number is compared to an address carried on the initialization bus to determine if the memory is being addressed.

* * * * *